US007391107B2

(12) United States Patent
Hummler

(10) Patent No.: US 7,391,107 B2
(45) Date of Patent: Jun. 24, 2008

(54) SIGNAL ROUTING ON REDISTRIBUTION LAYER

(75) Inventor: Klaus Hummler, Apex, NC (US)

(73) Assignee: Infineon Technologies AG, Munich (DE)

( * ) Notice: Subject to any disclaimer, the term of this patent is extended or adjusted under 35 U.S.C. 154(b) by 244 days.

(21) Appl. No.: 11/206,481

(22) Filed: Aug. 18, 2005

(65) Prior Publication Data

US 2007/0042591 A1 Feb. 22, 2007

(51) Int. Cl.
*H01L 23/48* (2006.01)

(52) U.S. Cl. ........................ 257/690; 257/692; 257/621; 257/780; 257/781; 257/784; 257/E23.012; 257/926

(58) Field of Classification Search ................. 257/621, 257/690, 692, 780–786, E23.012, 926
See application file for complete search history.

(56) References Cited

U.S. PATENT DOCUMENTS 6,284,639 B1 9/2001 Aschenbrenner et al.
2005/0248034 A1 * 11/2005 Takayama et al. ........... 257/758

* cited by examiner

*Primary Examiner*—Jasmine J Clark
(74) *Attorney, Agent, or Firm*—Dicke, Billig & Czaja, PLLC

(57) ABSTRACT

A semiconductor wafer has a dielectric layer, a metal last layer, a passivation layer, and a redistribution layer. The metal last layer is formed over the dielectric layer, and the metal last layer has first and second locations that are spaced apart from each other. The passivation layer is formed over the metal last layer. The redistribution layer is formed over the passivation layer. The redistribution layer has a signal routing wire coupled to the first location of the metal last layer and to the second location of the metal last layer.

15 Claims, 2 Drawing Sheets

SIGNAL ROUTING ON REDISTRIBUTION LAYER

BACKGROUND

The present invention relates to a semiconductor device having a redistribution layer. More particularly, the redistribution layer of the semiconductor device includes a signal routing line.

Many semiconductor devices utilize wafer level packaging in integrated circuits. With wafer-level packaging, fabrication of the semiconductor device typically includes device interconnection and device protection processes, including a passivation layer over the silicon die. Bond pads typically extend out through the passivation layer for interconnection with other components of an application.

Within such processes, redistribution layers are widely used to redistribute these bond pads from one location to another. In many instances, the redistribution layer is an inexpensive way to adapt one particularly configured silicon die to several different packaging applications and assembly scenarios. Redistribution layers can therefore provide flexibility to customize a particular silicon die to various applications.

Typically, a redistribution layer is formed on top of the final passivation layer of the silicon die by relatively inexpensive processes. For example, this may be accomplished using standard photolithography and thin-film deposition techniques and electroplating. With redistribution layers, wide metal lines redistribute bond pad signals of the original silicon die, which are typically located in the center of the die, to new locations which are more convenient for the specific application, typically along the edge of the die. Typically, a redistribution layer is added to a chip after the chip is fabricated, and thus, a redistribution layer is not typically involved in the design of the internal interconnection of the chip.

For these and other reasons, there is a need for the present invention.

SUMMARY

One aspect of the present invention provides a semiconductor device having a dielectric layer, a metal last layer, a passivation layer, and a redistribution layer. The metal last layer is formed over the dielectric layer, and the metal last layer has first and second locations that are spaced apart from each other. The passivation layer is formed over the metal last layer. The redistribution layer is formed over the passivation layer. The redistribution layer has a signal routing wire coupled to the first location of the metal last layer and to the second location of the metal last layer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
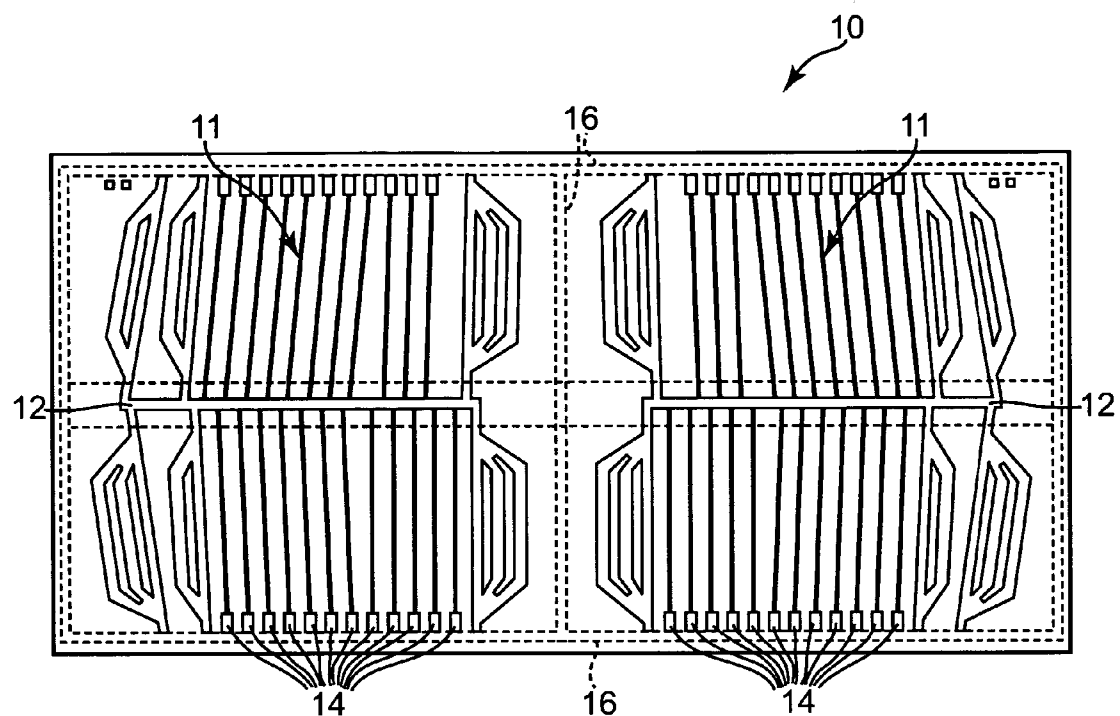
FIG. 1 illustrates a top level plan view of a redistribution layer on a semiconductor device.

FIG. 1 illustrates semiconductor device 10 with redistribution layer 11 on its top surface. Redistribution layer 11 includes center pads 12 and edge pads 14 with metal redistribution lines connected therebetween. Redistribution layer 11 is formed over a final passivation layer of semiconductor device 10. In this way, redistribution layer 11 redistributes signals from certain locations (proximate to center pads 12) on semiconductor device 10 to alternative locations (proximate to edge pads 14).

Figure 2:
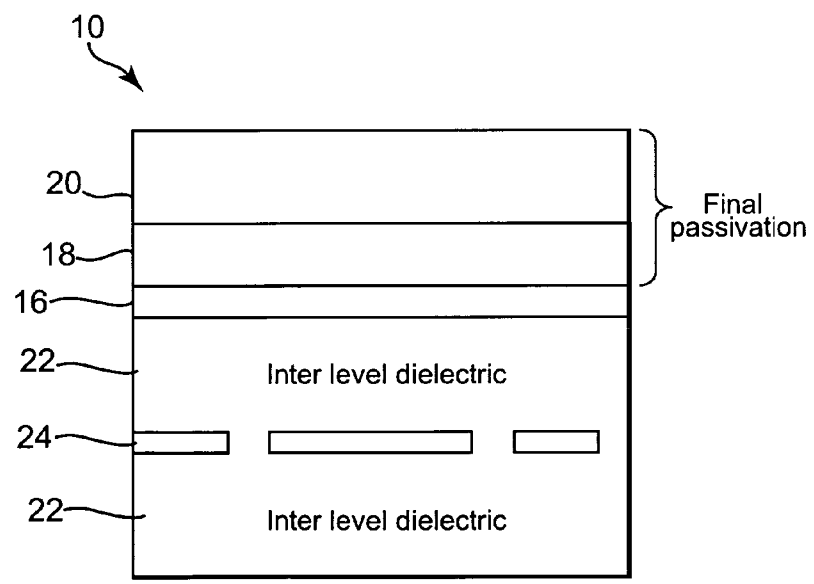
FIG. 2 illustrates a cross-section of a semiconductor device.

FIG. 2 illustrates a cross-section of semiconductor device 10 from FIG. 1. Various layers of the semiconductor device 10 are illustrated. Metal last layer 16 is illustrated on top of an upper inter-level dielectric layer 22. A lower-level metal layer 24 is illustrated between upper and lower inter-level dielectric layers 22. Final passivation layers 18 and 22 are illustrated on top of semiconductor device 10.

In one typical application, semiconductor device 10 includes device interconnection and device protection processes. The device interconnection typically includes various metal layers, such as lower-level metal layer 24 and metal last layer 16, and also includes dielectric layers, such as upper and lower inter-level dielectric layers 22. The device protection processes typically includes at least passivation layers 18 and 22. In the illustration of FIG. 1, metal last layer 16 is actually below the surface on which redistribution layer 11 is illustrated, and thus, it is illustrated with dotted lines. Bond pads typically extend down through passivation layers 18 and 22 to metal last layer 16 in order to provide connectivity from outside semiconductor device 10 to the internal device interconnection.

In one typical application, redistribution layer 11 is fabricated over a semiconductor device, which is a dynamic random access memory (DRAM) chip. In this way, center pads 12 of redistribution layer 11 couple with bond pads of the semiconductor chip that extend externally from its center. Redistribution layer 11 then redistributes the signals from these bond pads to edge pads 16 on the outside of the DRAM chip. In this way, signals may be more accessible or convenient for the specific application of the DRAM chip. In one case, the routed signals include DRAM I/O, the address signals, the command signals and power signals for the DRAM chip.

Figure 3:
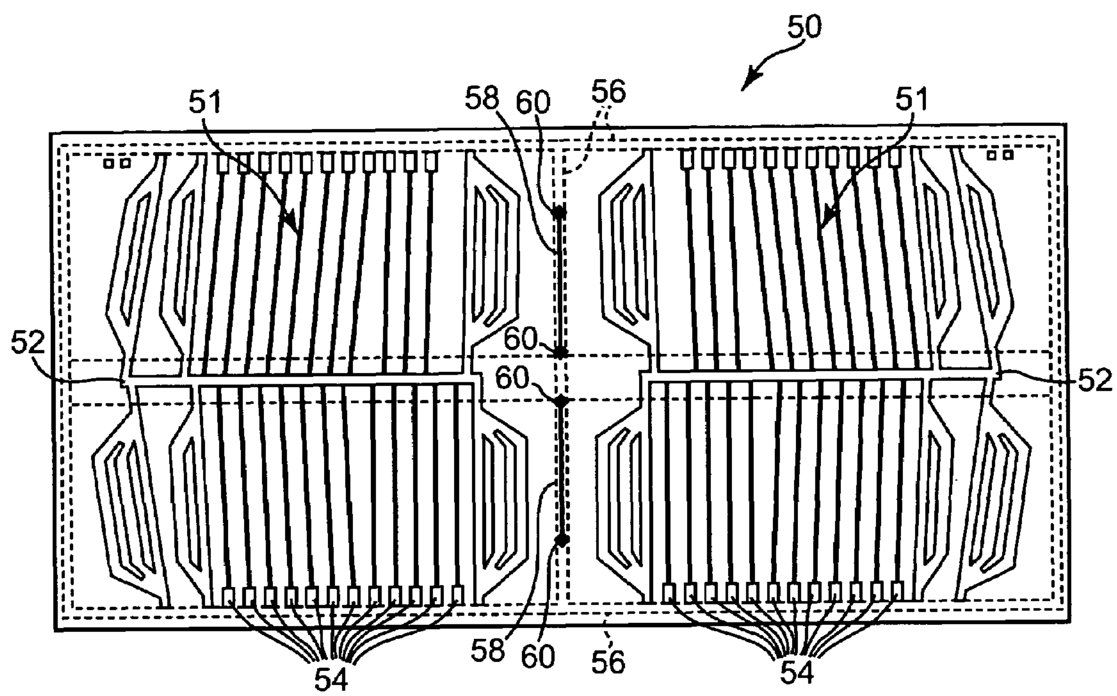
FIG. 3 illustrates a top plan view of a redistribution layer and signal routing line in accordance with one embodiment of the present invention.
Figure 4:
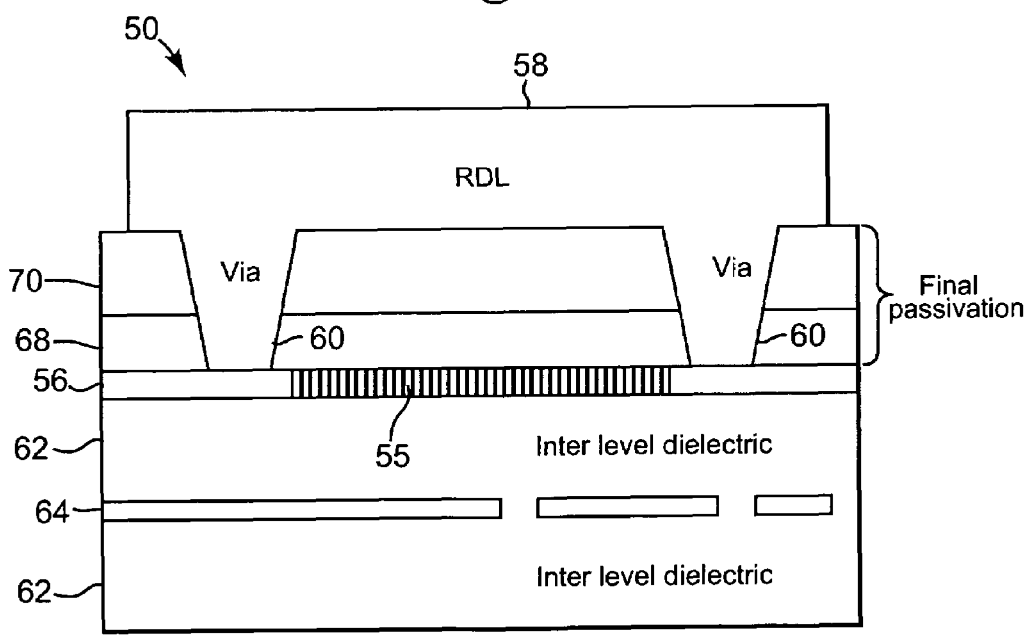
FIG. 4 illustrates a cross section of a semiconductor device with a redistribution layer and signal routing line in accordance with one embodiment of the present invention.

FIGS. 3 and 4 respectively illustrate plan and cross-sectional views of semiconductor device 50 with a redistribution layer 51 in accordance with one embodiment of the present invention. In FIG. 3, redistribution layer 51 is illustrated including center pads 52 and edge pads 54, with metal redistribution lines connected therebetween. In accordance with one embodiment, redistribution layer 51 of semiconductor device 50 also includes signal routing lines 58 and vias 60. Semiconductor device 50 also includes metal last layer 56 (illustrated below surface in FIG. 3, and thus, with dotted lines).

FIG. 4 illustrates a cross-sectional view of semiconductor device 50, including a lower-level metal layer 64 between upper and lower inter-level dielectric layers 62, metal last layer 56, passivation layers 68 and 70, and signal routing lines 58 of redistribution layer 51. Vias 60 are illustrated coupling signal routing lines 58 to metal last layer 56. Also illustrated is an optional parallel connection portion 55 in the metal last layer 56.

In one embodiment of semiconductor device 50, signal routing lines 58 of redistribution layer 51 engage metal last layer 56 with vias 60, route signals from metal last layer 56 up to redistribution layer 51, and then route signals back to a different location of metal last layer 56, also using vias 60. In this way, redistribution layer 51 is incorporated into the design of the interconnection of semiconductor device 50 such that selected signal routing previously done exclusively below passivation layers 68 and 70 is now accomplished above passivation layers 68 and 70 and in redistribution layer 51. Consequently, valuable space in the layers of semiconductor device 50 below passivation layers 68 and 70 can be saved by moving some connections that were previously in these lower layers above into redistribution layer 51 using signal routing lines 58 and vias 60.

In situations where redistribution layer 51 is incorporated into the design of the interconnection of semiconductor device 50, such that selected signal routing is now accomplished above passivation layers 68 and 70 in signal routing lines 58 of redistribution layer 51, the chip will not be operational without redistribution layer 51. In prior designs, a redistribution layer was used just to relocate signals, but the chip remained operational without the redistribution layer.

In one exemplary embodiment semiconductor wafer 50 is a dynamic random access memory (DRAM) chip. In such an embodiment, metal last layer 56 is used for power routing for internal device interconnection within the DRAM chip. In some designs, interconnection with the DRAM chip is quite complex and power routing within the layers of semiconductor device 50 is challenging, leading to undesirable chip size increases. In some applications, power routing needs to be accomplished to many non-proximate locations. Other applications require substantial power to be delivered to various locations within the various layers of semiconductor device 50. Such applications can require sizable power lines and complex routing involving the additions of layers and/or size to semiconductor device 50. Furthermore, fabrication of metal layers like metal last layer 56 involves using expensive manufacturing techniques.

In this way, some embodiments of semiconductor device 50 include signal routing lines 58 of redistribution layer 51 configured to run relatively wide wires that can carry significant power to various chip locations as needed. The power is routed up to signal routing lines 58 of redistribution layer 51 and then delivered back down to metal last layer 56 where needed. Since this routing occurs up in redistribution layer 51, this added capacity and flexibility does not add to the chip size under passivation layers 68 and 70. In cases where redistribution layer 51 is added to redistribute signals from bond pads in one location to another location for connectivity to another device, signal routing lines 58 can be added to redistribution layer 51 as well without significantly adding to the size of semiconductor device 50. Thus, in applications that already include a redistribution layer, the addition of signal routing lines 58 do not add to the size of the chip.

For example, in some embodiments, semiconductor device 50 needs to supply a sufficient amount of current to several different locations on the chip. Rather than add to, and complicate, metal last layer 56, or add other metal layers below passivation layers 68 and 70, and thereby increase the overall size of the chip, however, current is instead routed up through passivation layers 68 and 70 to redistribution layer 51. Specifically, current is routed to signal routing wire 58, which is in redistribution layer 51 above passivation layers 68 and 70. Then, signal routing wire 58 is configured to reroute the signal to a different location on the chip, and then direct it back down through vias 60 to various locations on metal last layer 56 as needed. In this way, the routing lines internal to the chip can be relatively small, since they are paralleled with signal routing wire 58 on redistribution layer 51.

In some applications, a semiconductor chip will be configured such that power needs to be routed from the center of the chip to the edge of the chip, because there are drivers located out on the edge of the chip. Such drivers are typically configured to drive multiple elements on the chip, and thus, require a significant amount of power. With a traditional chip package, parallel wires would be required on the package level, as would a bond pad out at the chip edge. Such additional parallel wires and bond pads would add significantly to the overall size of the chip package.

In one embodiment, semiconductor device 50 is configured to route additional power from the center of the device 50 to the edge of the device 50 via redistribution layer 51. Also in one embodiment, redistribution layer 51 utilizes very small vias 60 to interface with signal routing wires 58. These added vias 60 are significantly smaller than the added bond pad to parallel wire configurations discussed above in traditional chip packages. Also, redistribution layer 51 has low resistive and capacitive parasitics, which provides favorable conditions for routing signals up though signal routing lines 58.

In one embodiment, signal routing wires 58 are manufactured with redistribution layer 51 using conventional techniques such as photolithography and thin-film deposition techniques or electroplating. In this way, the processing of signal routing wires 58 within redistribution layer 51 is more economical that would be fabricating these same signal paths within metal layers such as metal last layer 56. Since metal last layer 56 is part of the chip fabrication before protective layers like passivation layers 68 and 70 are added, it requires much more expensive fabrication techniques, than do signal routing wires 58. Since signal routing wires 58 are part of the redistribution layer 51, which is added to the chip after the chip is fabricated and passivation layers 68 and 70 are added, conventional and relatively inexpensive fabrication techniques are used for these layers.

Vias 60 are added just before redistribution layer 51 with signal routing wires 58 are formed, and are aligned with signal routing wires 58 such that a signal path is formed in and out of the chip with vias 60 and signal routing wires 58. This provides a wire path, for example, between the center and the edge of the chip that is able to carry a considerable amount of current. Since signal routing wires 58 are above the passivation layers, and are added before the dies are singulated, the metal last layer below the passivation layer is not disrupted and the chip design for all other signals on the chip are also unaffected. In further embodiments, signal routing wires 58 carry other signals beside power. For example, in a DRAM chip application such signals include DRAM I/O, address signals, and command signals In one embodiment, vias 60 are significantly smaller than are bond pads 52 and 54, which couple signals to metal last layer 56. In one case, bond pads 52 and 54 are on the order of 100 micrometers by 100 micrometers, whereas vias 60 are on the order of 5 micrometers by 5 micrometers. In this way, signals can more easily and readily be routed up to the signal routing lines 58 of redistribution layer 51, and then routed back down to metal last layer 56 without significantly disrupting other signals on the chip during the chip design.

In some embodiments where there is significant signal congestion on metal last layer 56, routing signal up to signal routing lines 58 of redistribution layer 51 can be effective in avoiding congestion without increasing chip size. Since vias 60 are significantly smaller than normal bond pads 52 and 54, they provide for flexible placement on the chip. In one embodiment, the contact resistance from metal last layer 56 to redistribution layer 51 essentially determines the size of vias 60.

In one alternative embodiment, optional parallel connection portion 55 is added in the metal last layer 56. In this way, for applications that require large amounts of power to be delivered to a location, both signal routing lines 58 of redistribution layer 51 and parallel connection portion 55 of metal last layer 56 can be used to deliver power in a parallel manner.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor wafer comprising:

a dielectric layer;

a metal last layer over the dielectric layer, the metal last layer having first and second locations spaced apart from each other;

a passivation layer over the metal last layer;

a redistribution layer over the passivation layer; and a signal routing wire within the redistribution layer, wherein the signal routing wire is coupled to both the first location and the second location of the metal last layer.

2. The semiconductor wafer of claim 1, wherein a signal from the metal last layer at the first location is routed up to the signal routing wire and then routed back down to the metal last layer at the second location.

3. The semiconductor wafer of claim 2 further including a first via coupling the first location of the metal last layer with the signal routing wire through the passivation layer and a second via coupling the second location of the metal last layer with the signal routing wire through the passivation layer.

4. The semiconductor wafer of claim 3, wherein the first and second vias through the passivation layer are significantly less than 100 micrometers by 100 micrometers in size.

5. The semiconductor wafer of claim 3, wherein the first and second vias through the passivation layer are on the order of 5 micrometers by 5 micrometers in size.

6. A semiconductor random access memory device comprising:

a semiconductor wafer having a top surface with a center portion and an edge portion;

a set of wafer bond pads on the top surface of the semiconductor wafer at the center portion;

a redistribution layer on the top surface of the semiconductor wafer, wherein the redistribution layer has redistribution center pads coupled to the set of wafer bond pads, wherein the redistribution layer has redistribution edge pads coupled to the redistribution center pads, wherein the redistribution edge pads are located near the edge portion of the semiconductor wafer, and wherein a signal routing wire within the redistribution layer routes a signal from the semiconductor wafer up to the redistribution layer and back down to the semiconductor wafer.

7. The semiconductor random access memory device of claim 6, wherein the semiconductor wafer includes a dielectric layer, a metal last layer over the dielectric layer and a passivation layer over the metal last layer.

8. The semiconductor random access memory device of claim 7, wherein a signal from the metal last layer is routed up to the signal routing wire and then routed back down to the metal last layer.

9. The semiconductor random access memory device of claim 8, further including vias coupling the metal last layer with the signal routing wire through the passivation layer in at least two locations.

10. The semiconductor random access memory device of claim 8, wherein the signal from the metal last layer is a power signal.

11. The semiconductor random access memory device of claim 8, wherein the metal last layer further includes a parallel connection portion for carrying a signal in parallel to the signal from the signal routing wire.

12. A multi-layer semiconductor wafer comprising:

a dielectric layer;

a metal last layer over the dielectric layer, the metal last layer having first and second locations spaced apart from each other;

a passivation layer over the metal last layer;

a redistribution layer over the p passivation layer, the redistribution layer including bond pad; and means within the redistribution layer for routing a signal from the metal last layer up through the passivation layer to the redistribution layer, and for routing the signal back down through the passivation layer to the metal last layer.

13. A multilaver semiconductor wafer comprising:

a dielectric layer;

a metal last layer over the dielectric layer, the metal last layer having first and second locations spaced apart from each other;

a passivation layer over the metal last layer;

a redistribution layer over the passivation layer; and means within the redistribution layer for routing a signal from the metal last layer up through the passivation layer to the redistribution layer, and for routing the signal back down through the passivation layer to the metal last layer;

wherein the redistribution layer has redistribution center pads coupled to the metal last layer, wherein the redistribution layer has redistribution edge pads coupled to the redistribution center pads and wherein the redistribution edge pads are located near and edge portion of the semiconductor wafer.

14. The multi-layer semiconductor wafer of claim 12, further including a first via coupling the metal last layer with means within the redistribution layer for routing a signal from the metal last layer to the redistribution layer.

15. The multi-layer semiconductor wafer of claim 14, further including a second via coupling the means within the redistribution layer for routing the signal back down to the metal last layer with the metal last layer.

* * * * *

UNITED STATES PATENT AND TRADEMARK OFFICE

CERTIFICATE OF CORRECTION

PATENT NO. : 7,391,107 B2
APPLICATION NO. : 11/206481
DATED : June 24, 2008
INVENTOR(S) : Hummler It is certified that error appears in the above-identified patent and that said Letters Patent is hereby corrected as shown below:

Column 5, line 3, delete “signals” and insert in place thereof --signals.--.

Column 6, line 34, delete “the p” and insert in place thereof --the--.

Column 6, line 41, delete “multilaver” and insert in place thereof --multi-layer--.

Signed and Sealed this

Fifteenth Day of June, 2010

David J. Kappos
*Director of the United States Patent and Trademark Office*